US010782607B2

(12) United States Patent
Chan et al.

(10) Patent No.: US 10,782,607 B2
(45) Date of Patent: Sep. 22, 2020

(54) RETICLES FOR LITHOGRAPHY

(71) Applicants: IMEC VZW, Leuven (BE); Katholieke Universiteit Leuven, KU LEUVEN R&D, Leuven (BE)

(72) Inventors: Boon Teik Chan, Leuven (BE); Kim Vu Luong, Leuven (BE); Vicky Philipsen, Tervuren (BE); Efrain Altamirano Sanchez, Kessel-Lo (BE); Kevin Vandersmissen, Tervuren (BE)

(73) Assignees: IMEC VZW, Leuven (BE); KATHOLIEKE UNIVERSITEIT LEUVEN, KU LEUVEN R&D, Leuven (BE)

(*) Notice: Subject to any disclaimer, the term of this patent is extended or adjusted under 35 U.S.C. 154(b) by 204 days.

(21) Appl. No.: 16/123,058

(22) Filed: Sep. 6, 2018

(65) Prior Publication Data
US 2019/0079384 A1 Mar. 14, 2019

(30) Foreign Application Priority Data
Sep. 9, 2017 (EP) .................................. 17190264

(51) Int. Cl.
*G03F 1/24* (2012.01)
*G03F 1/22* (2012.01)
(Continued)

(52) U.S. Cl.
CPC .................. *G03F 1/24* (2013.01); *G03F 1/22* (2013.01); *G03F 1/48* (2013.01); *G03F 1/52* (2013.01);
(Continued)

(58) Field of Classification Search
CPC ..... G03F 1/22; G03F 1/24; G03F 1/80; G03F 1/58; G03F 1/48; G03F 1/54;
(Continued)

(56) References Cited

U.S. PATENT DOCUMENTS 3,877,810 A * 4/1975 Feldstein .................. G03F 1/54
355/133
6,027,595 A * 2/2000 Suleski .................. B82Y 10/00
156/230
(Continued)

FOREIGN PATENT DOCUMENTS

CN 104298068 A 1/2015
EP 1333323 A2 8/2003
(Continued)

OTHER PUBLICATIONS

Machine translation of WO 2010-113700 (2010).*
(Continued)

*Primary Examiner* — Martin J Angebranndt
(74) *Attorney, Agent, or Firm* — McDonnell Boehnen Hulbert & Berghoff LLP

(57) ABSTRACT

An example method for making a reticle includes providing an assembly. The assembly includes an extreme ultraviolet mirror and a cavity overlaying at least a bottom part of the extreme ultraviolet mirror. The method also includes at least partially filling the cavity with an extreme ultraviolet absorbing structure that includes a metallic material that includes an element selected from Ni, Co, Sb, Ag, In, and Sn, by forming the extreme ultraviolet absorbing structure selectively in the cavity.

17 Claims, 12 Drawing Sheets

(51) Int. Cl.
*G03F 1/52* (2012.01)
*G03F 1/54* (2012.01)
*G03F 1/48* (2012.01)
*G03F 1/80* (2012.01)
*G03F 7/20* (2006.01)
*H01L 21/768* (2006.01)
*G03F 1/58* (2012.01)
*B82Y 40/00* (2011.01)

(52) U.S. Cl.
CPC .............. *G03F 1/54* (2013.01); *G03F 1/58* (2013.01); *G03F 1/80* (2013.01); *G03F 7/2002* (2013.01); *H01L 21/76879* (2013.01); *B82Y 40/00* (2013.01); *G21K 2201/061* (2013.01)

(58) Field of Classification Search
CPC ... G03F 7/2002; G03F 7/20; H01L 21/76879; G21K 2201/061; B82Y 40/00
See application file for complete search history.

(56) References Cited

U.S. PATENT DOCUMENTS

| | | | |
|---|---|---|---|
| 6,593,041 | B2 | 7/2003 | Yan |
| 8,962,220 | B2* | 2/2015 | Matsuo .................. B82Y 10/00 430/5 |
| 9,075,316 | B2 | 7/2015 | Singh |
| 9,134,604 | B2* | 9/2015 | Shih .......................... G03F 1/24 |
| 9,588,419 | B2 | 3/2017 | Lu et al. |
| 9,612,522 | B2 | 4/2017 | Hassan et al. |
| 10,720,336 | B2* | 7/2020 | Gallagher ................. G03F 1/36 |
| 2003/0194850 | A1 | 10/2003 | Lewis et al. |
| 2004/0091789 | A1* | 5/2004 | Han .......................... G03F 1/24 430/5 |
| 2005/0106474 | A1 | 5/2005 | Kindt et al. |
| 2009/0191469 | A1* | 7/2009 | Charpin-Nicolle .... B82Y 40/00 430/5 |
| 2011/0159416 | A1* | 6/2011 | Jeong ..................... B82Y 40/00 430/5 |
| 2012/0045712 | A1 | 2/2012 | Chang et al. |
| 2012/0107733 | A1* | 5/2012 | Hayashi ................. B82Y 40/00 430/5 |
| 2013/0100428 | A1* | 4/2013 | Ruoff ..................... B82Y 10/00 355/67 |
| 2013/0280643 | A1* | 10/2013 | Hsu ..................... H01L 21/0337 430/5 |
| 2013/0323931 | A1* | 12/2013 | Lu .............................. G03F 7/42 438/703 |
| 2014/0272681 | A1* | 9/2014 | Huang ...................... G03F 1/24 430/5 |
| 2015/0212402 | A1* | 7/2015 | Patil .......................... G03F 1/24 430/5 |
| 2015/0331307 | A1* | 11/2015 | Lu .............................. G03F 1/24 430/5 |
| 2016/0178997 | A1* | 6/2016 | Watanabe ................. G03F 1/24 430/5 |
| 2016/0209750 | A1 | 7/2016 | Dier et al. |
| 2018/0031965 | A1* | 2/2018 | Jindal ........................ G03F 1/60 |
| 2019/0086791 | A1* | 3/2019 | Tanabe ...................... G03F 1/54 |

FOREIGN PATENT DOCUMENTS

| | | | | |
|---|---|---|---|---|
| EP | 1412817 | | 4/2004 | |
| EP | 1333323 | A3 | 10/2004 | |
| JP | 2002-261005 | * | 2/2002 | .............. G03F 1/54 |
| KR | 101095681 | B1 | 12/2011 | |
| KR | 1020120092955 | A | 8/2012 | |
| KR | 101579852 | B * | 12/2015 | |
| KR | 1020170021191 | A | 2/2017 | |
| WO | 03/012546 | A2 | 2/2003 | |
| WO | 03/012546 | A3 | 2/2003 | |
| WO | 2010113700 | * | 10/2010 | .............. G03F 1/16 |

OTHER PUBLICATIONS

Machgione translation of JP 2002-261005 (2002).*
Machine translation of KR 10157852B (2015).*
European Search Report, European Patent Application No. 17190264.6, dated Mar. 26, 2018, 11 pages.
Philipsen, Vicky et al., "Reducing EUV Mask 3D Effects by Alternative Metal Absorbers", Proc. of SPIE, vol. 10143, 2017, pp. 1-15.
Rastegar, Abbas et al., "Study of Alternative Capping and Absorber Layers for Extreme Ultraviolet (EUV) Masks for Sub-16 nm Half-Pitch Nodes", Proc. of SPIE, vol. 9048, 2014, pp. 1-11.
Ruoff, Johannes, "Impact of Mask Topography and Multilayer Stack on High NA Imaging of EUV Masks", Proc. of SPIE, vol. 7823, 2010, pp. 1-15.
Schmoeller, Thomas et al., "The Impact of Mask Design on EUV Imaging", Proc. of SPIE, vol. 7379, 2009, pp. 1-11.

* cited by examiner

RETICLES FOR LITHOGRAPHY

CROSS-REFERENCE TO RELATED APPLICATIONS

The present application is a non-provisional patent application claiming priority to European Patent Application No. 17190264.6, filed Sep. 9, 2017, the contents of which are hereby incorporated by reference.

FIELD OF THE DISCLOSURE

The present disclosure is related to the field of lithography. More specifically, it is related to fabrication of reticles potentially suitable for Extreme Ultra-Violet Lithography (EUVL).

BACKGROUND

The desire to reduce feature sizes in IC manufacturing, based on Moore's Law, incentivizes the transition to EUVL for patterning features having a critical dimension (CD) of less than 10 nm. EUVL generally involves the use of light having a wavelength of 13.5 nm to enable single exposure patterning of features having a dimension smaller than 10 nm, potentially making it possible to keep up with Moore's Law.

The absorber material present above the multi-layer mirror in the reticles used for EUVL typically plays an important role in terms of absorption of EUV light during lithography. Therefore, it is desirable that the absorber material possesses a high extinction coefficient or k-value. Currently, Ta-based absorber materials are used in EUV reticles having a typical thickness of 70 nm. However, these traditional EUV masks suffer from Mask 3D (M3D) effects such as shadowing differences between horizontal and vertical patterns, best focus shifts through pitch, and pattern shifts through focus. M3D effects result from the interaction between the oblique incident EUV light and the patterned absorber material with typical thickness values on the order of several wavelengths. M3D effects can make it difficult to perform optical proximity correction, and can lead to overlay problems. It has been shown that reducing the thickness of the current Ta-based absorber materials is generally not sufficient to mitigate M3D effects ("Reducing EUV mask 3D effects by alternative metal absorbers", Conference Proceedings of SPIE 2017).

Furthermore, in addition to the absorber material having suitable material properties making it compatible for use in reticles in an EUV scanner environment and making it environmentally friendly, it should also be compatible with the current EUV reticle fabrication processes. This compatibility generally should ensure obtaining absorber profiles as square as possible, the absence of mask defects on the mask, and the absence of damage on the capping layer protecting the multi-layer mirror or on the multi-layer mirror itself, during reticle fabrication. The absorber material is typically provided by blanket layer deposition methods or by non-selective deposition methods on the multi-layer mirror, which can necessitate further the use of etch-back or chemical mechanical planarization (CMP) techniques to arrive at the desired absorber patterns. However, these techniques can make the manufacturing cost of reticles not only expensive due to the introduction of these further steps, but also etch-back or CMP techniques can damage the Ru capping and/or the multi-layer mirror, which is typically undesirable.

There is, therefore, a need in the art for methods for fabricating EUV reticles, which help resolve some or all of the issues outlined above.

SUMMARY

Embodiments of this disclosure can help form EUV reticles and provide EUV reticles or intermediates in the provision thereof.

Embodiments of this disclosure can help attain EUV absorbing structures having sidewalls that are straight, i.e., substantially free from angles and not curved when the surface roughness is neglected.

Embodiments of this disclosure can help attain EUV absorbing structures having sidewalls that are vertical or close to vertical.

Embodiments of this disclosure can help form EUV absorbing structures having zero no or negligible defects on the mask, which means that during patterning no or a few damages are created on the EUV mirror or its capping layer and therefore its reflective properties are not altered where no EUV absorbing structure is intended. In the comparative subtractive method, EUV absorbing materials removed by physical etching, such as Ni or Co, tend to deposit on the EUV mirror outside of where the EUV absorbing material is desired.

Embodiments of this disclosure can help attain EUV absorbing structures having no voids therein.

Embodiments of this disclosure can help attain EUV absorbing structures that include amorphous or polycrystalline material having an average crystallite size of 10 nm or smaller. This translates into an EUV absorbing structure having relatively smooth side walls.

Embodiments of this disclosure can help attain a capping layer having no or few damages. Within embodiments of this disclosure, the capping layer is typically left undamaged in order to keep its protective properties for the EUV mirror underneath.

Embodiments of this disclosure can help attain EUV absorbing structures above the EUV mirror having low or no internal stress so that no or little bending of the reticle patterns occurs.

Embodiments of this disclosure can help attain EUV absorbing structures that are stable in the temperature range 20-250° C., e.g., 20-180° C.

Embodiments of this disclosure can help attain a width as small as or even smaller than 64 nm for the EUV absorbing structure, which translates into features as small as or even smaller than 16 nm on the wafer at a numerical aperture (NA) of 0.33. Embodiments of the present disclosure can even permit the use of a width much smaller than 64 nm for the EUV absorbing structure, such as a width of 24 nm, which translates into features as small as 6 nm on the wafer a numerical aperture (NA) of 0.33.

Embodiments of this disclosure can help attain reduced manufacturing cost of EUV reticles when compared to subtractive or non-selective methods.

The above objective is accomplished by a method and device according to the present disclosure.

In a first aspect, the present disclosure relates to a method for making a reticle, comprising: providing an assembly comprising: an extreme ultraviolet mirror; and a cavity overlaying at least a bottom part of the extreme ultraviolet mirror; and at least partly filling the cavity with an extreme ultraviolet absorbing structure comprising a metallic material comprising an element selected from Ni, Co, Sb, Ag, In, and Sn, by forming the extreme ultraviolet absorbing structure selectively in the cavity.

In some embodiments, the present disclosure relates to a method for making an extreme ultraviolet reticle, comprising: providing an assembly comprising: an extreme ultraviolet mirror; and a cavity overlaying at least a bottom part of the extreme ultraviolet mirror, the cavity being either: comprised in a dielectric mask layer overlaying the extreme ultraviolet mirror, the cavity having a depth extending from a top surface of the dielectric mask layer to a bottom surface of the dielectric mask layer, or comprised in the extreme ultraviolet mirror, the cavity having a depth extending from a top surface of the extreme ultraviolet mirror to a level above the bottom surface of the extreme ultraviolet mirror, and filling the cavity with an extreme ultraviolet absorbing structure comprising a metallic material by forming the extreme ultraviolet absorbing structure selectively in the cavity.

In another embodiment, the present disclosure relates to a method for making an ultraviolet reticle, comprising: providing an assembly comprising: an extreme ultraviolet mirror; and a cavity overlaying at least a bottom part of the extreme ultraviolet mirror; at least partly filling the cavity with an extreme ultraviolet absorbing structure comprising a metallic material comprising an element selected from Ni, Co, Sb, Ag, In, and Sn, by forming the extreme ultraviolet absorbing structure selectively in the cavity.

In another embodiment, the present disclosure relates to an extreme ultraviolet reticle, comprising: an extreme ultraviolet mirror; and an extreme ultraviolet absorbing structure comprising a metallic material comprising an element selected from Ni, Co, Sb, Ag, In, and Sn.

In another embodiment, the present disclosure relates to an intermediate structure for the making of an extreme ultraviolet reticle, the intermediate structure comprising an extreme ultraviolet mirror; a mask layer over the extreme ultraviolet mirror, the mask layer being patterned with a cavity extending from a top surface to a bottom surface of the mask layer; and an extreme ultraviolet absorbing structure filling at least partly the cavity, the extreme ultraviolet absorbing structure comprising a metallic material comprising an element selected from Ni, Co, Sb, Ag, In, and Sn.

Various aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the claims. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
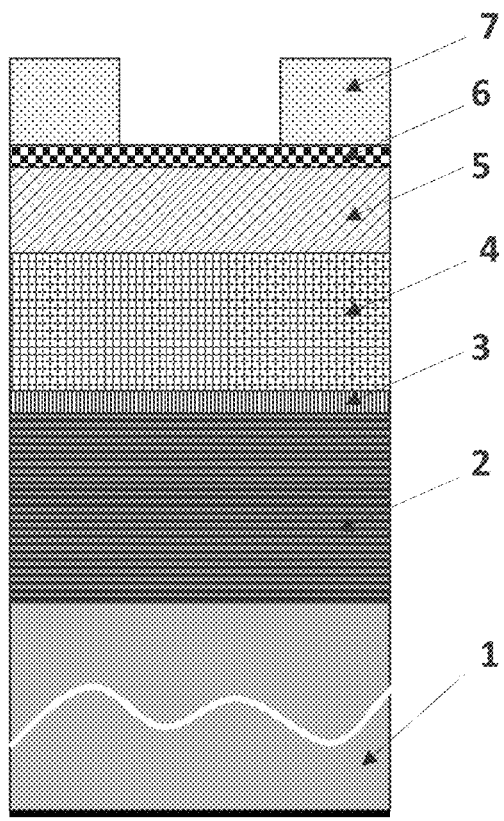
FIG. 1 is a schematic representation of a vertical cross-section of intermediates in the formation of a reticle during a method according to an embodiment of the present disclosure.

In the different figures, the same reference signs generally refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Embodiments of the disclosure will be described with reference to certain drawings but the scope of the claims is not limited thereto. The drawings described are only schematic and are non-limiting. In the drawings, the size of some of the elements may be exaggerated and not drawn to scale for illustrative purposes.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure are capable of operation in other orientations than described or illustrated herein.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of embodiments of the disclosure, various features of the embodiments are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

As used herein, and unless otherwise specified, the term extreme ultraviolet (EUV) may be understood to refer to a part of the electromagnetic spectrum spanning wavelengths from 124 nm down to 10 nm.

As used herein, and unless otherwise specified, the refractive index (n) and extinction coefficient ($\kappa$) are respectively the real and imaginary parts of the complex index of refraction ($\vec{n}=n-i\kappa$). Their values herein can refer to measurements performed at a wavelength of 13.5 nm. 13.5 nm is a commonly used wavelength for extreme ultraviolet lithography, though the disclosure is in no way limited to this specific wavelength. Both the refractive index and the extinction coefficient can, for example, be obtained from angle resolved reflectance measurements; or from angle-and-wavelength resolved reflectance measurements (thereby increasing the redundancy available to fit both n an $\kappa$). Other possibilities available to the skilled person include, but are not limited to, transmittance and/or absorbance measurements.

As used herein, the average crystallite size of an alloy can refer to the average size of crystals within the alloy. It may also be referred to as the grain size.

Embodiments of the disclosure will now be described. It is clear that other embodiments of the disclosure can be configured according to the knowledge of persons skilled in the art without departing from the technical teaching of the disclosure.

In some embodiments, the present disclosure relates to a method for making an extreme ultraviolet reticle. The method comprises providing an assembly comprising: (i) an extreme ultraviolet mirror; and (ii) a cavity overlaying at least a bottom part of the extreme ultraviolet mirror.

The extreme ultraviolet mirror will typically be on a substrate. The substrate may be any substrate but is typically a substrate suitable for use in manufacturing a mask for lithography. The substrate, may for example, be a quartz substrate. The extreme ultraviolet mirror may be any mirror suitable for reflecting extreme ultraviolet radiations. The EUV mirror may be a Bragg reflector comprising a multi-layer stack of a first material alternating with a second material, wherein the first and second material have different refractive indices and wherein the thickness of the layers is such that the optical path length within each layer corresponds to a quarter of the wavelength of the incident light (e.g. 13.5 nm EUV light). For instance, it can be a stack of Si layers alternated with Mo layers. In typical embodiments, a capping layer will be present on the extreme ultraviolet mirror. The capping layer is typically a Ru layer but can be any layer or multilayer suitable for protecting the extreme ultraviolet mirror from environmental degradation. Examples of such a layer or multilayer are a Rh layer or a $TiO_2/RuO_2$ multilayer. The thickness of the capping layer is generally chosen so that it does not reduce the reflectance at a 13.5 nm wavelength by more than 3%. The thickness of the capping layer can be for instance from 2 to 3 nm, e.g., 2.5 nm.

The assembly further comprises a cavity overlying at least a bottom part of the extreme ultraviolet mirror.

In some embodiments, the cavity may be overlying part of the top surface of the EUV mirror. In these embodiments, the cavity may expose part of the capping layer typically present on the EUV mirror or may expose part of the etch stop layer when such a layer is present above the EUV mirror and typically on the capping layer. The cavity may alternatively expose part of a seeding layer if such a layer is present on the capping layer. The seeding layer is generally a layer which promotes the selective formation of the EUV absorbing structure in the cavity. Typically, the seeding layer is a layer having the same chemical nature as the EUV absorbing structure. In these embodiments, the cavity is typically formed by providing a dielectric mask layer over the EUV mirror followed by patterning the dielectric mask layer so as to form the cavity.

The cavity may be provided by providing a dielectric patterned template having a cavity, or dielectric mask features separated by a cavity, having a depth extending from an upper surface of the patterned template throughout its thickness.

In embodiments, the mask layer may be formed of $SiO_2$. The $SiO_2$ mask layer is generally formed at a temperature below 250° C. and more typically below 180° C. Patterning the dielectric mask layer can be performed for instance by providing a spin-on-carbon (SoC) layer on the dielectric mask layer, providing a spin-on-glass layer (SoG) on the SoC layer, and forming a patterned photoresist on the SoG layer. The patterned photoresist can present an opening suitable for forming the cavity in the mask layer upon transfer therein. This transfer is typically obtained by etching through the SoG layer, the SoC layer, and the mask layer, and stopping at the capping layer.

In embodiments, the dielectric mask layer may be formed of SoC. Patterning the SoC mask layer can be performed, for instance, by providing a SoG layer on the SoC layer, and forming a patterned photoresist on the SoG layer. The patterned photoresist can present an opening suitable for forming the cavity in the mask layer upon transfer therein. This transfer is typically obtained by etching through the SoG layer and the SoC mask layer and stopping at the capping layer or on the etch stop layer if present.

In some embodiments, the cavity may be formed by providing a photoresist layer directly on the capping layer of the EUV mirror followed by patterning the photoresist layer so as to form the cavity in the photoresist. It is this cavity that can be at least partly filled with an extreme ultraviolet absorbing structure.

In some embodiments, the cavity may extend in the extreme ultraviolet mirror and the bottom of the cavity may be lower than the top surface of the extreme ultraviolet mirror but higher than the bottom surface of the extreme ultraviolet mirror. To form such a cavity, an extreme ultraviolet mirror may be provided on a substrate, a capping layer may be provided on the extreme ultraviolet mirror, a dielectric layer (e.g. $SiO_2$ or $Si_3N_4$) may be provided on the capping layer, an SoC layer may be provided on the dielectric layer, an SoG layer may be provided on the SoC layer, and a patterned photoresist may be provided on the SoG layer. The patterned photoresist can present an opening suitable for forming the cavity in the EUV mirror layer upon transfer therein. This transfer is typically obtained by etching through the SoG layer, the SoC layer, the dielectric layer, the capping layer, and the EUV mirror layer and stopping before reaching the bottom of the EUV mirror layer. The exact depth at which the etching stops may be controlled, for instance, by placing an etch stop layer at that depth in the EUV mirror.

In various embodiments, the cavity is overlaying at least a bottom part of the EUV mirror. In some embodiments, the cavity is situated above the level of the top surface of the EUV mirror and typically the lateral extent of the cavity overlaps with part of the lateral extent of the top surface of the EUV mirror. In some embodiments, the bottom of the cavity is situated above the level of the bottom surface of the EUV mirror but below the level of the top surface of the EUV mirror. Typically, the lateral extent of the cavity overlaps with part of the lateral extent of the bottom surface of the EUV mirror.

The cavity is typically defined by side walls and by a bottom surface. In embodiments, the side walls are formed of a dielectric material while in other embodiments, the sidewalls are formed of: an EUV mirror material, typically a capping material on the EUV mirror material, typically a self-assembled monolayer (SAM) material on the capping material.

The surfaces forming the cavity include the bottom of the cavity and its side walls. Each side wall generally forms an angle with the top surface on the EUV mirror ranging from 70° to 110° or from 75° to 105°.

The width of the cavity may, for instance, be from 3 nm to 300 nm or from 8 nm to 100 nm.

The material of the mask layer is generally non-crystalline. This is can be advantageous as it may contribute to the sidewalls of the cavity having a lower roughness. (This can be helpful in that when absorber material is selectively deposited and later when the mask is removed, the absorber patterns do not suffer much from Line Edge Roughness and Line Width Roughness.

In embodiments, a method includes at least partly filling the cavity with an EUV absorbing structure by forming the EUV absorbing structure selectively in the cavity. In other words, the EUV absorbing structure can be formed selectively in the cavity with respect to any surface not forming part of the cavity.

By at least partly filling the cavity, it is generally meant that although the whole lateral extent of the cavity is filled, the cavity may either be filled completely or filled up to a certain height below the top of the cavity.

In some embodiments, filling the cavity may be performed by electroless deposition (ELD) of the filling material.

In embodiments, the extreme ultraviolet absorbing structure may be formed selectively in the cavity by electroless deposition.

As explained in the background, conventional Ta-based absorber materials, due to their relatively low extinction coefficient value k, tend to require a relatively large thickness to be sufficiently absorbing. Such a large thickness can lead to M3D effects which generally cannot be entirely mitigated by simply reducing that thickness. The use of alternative absorber materials having a higher extinction coefficient k than current Ta-based materials but possessing a similar refractive index n (e.g., between 0.86 and 1.02, or between 0.88 and 1.00 at 13.5 nm) can help reduce the thickness of the EUV absorbing structure but typically requires a new formation method. As shown in the comparative example infra, finding suitable methods making use of such materials was a challenge. Embodiments of this disclosure help address that challenge.

Generally, and especially when the filling material is metallic, ELD may be used as it can be well suited to the selective deposition of metallic materials. The filling material generally forms a layer of electrically conductive material (e.g., a metallic layer) in the cavity. When the EUV absorbing structure is a multilayer, the bottom layer is generally a conductive material and more typically a metallic material. Conductive materials and metallic materials are preferred because they permit the filling step to be performed selectively by ELD. In particular, they can permit selective deposition on a Ru cap layer by ELD. Metallic materials are generally well suited for forming the EUV absorbing structure by methods of the present disclosure because they tend to have a high extinction coefficient k and they can be difficult to form by other methods.

In embodiments, the extreme ultraviolet absorbing structure may comprise a metallic material. In some embodiments, the extreme ultraviolet absorbing structure may consist of a metallic material.

The metallic material may for instance be a single metal, an alloy, or a doped metal or alloy.

Suitable metallic materials are typically selected from transition metals, post-transition metals, Sb and combination thereof.

Generally, the EUV absorbing structure has an extinction coefficient k of at least 0.040, more typically at least 0.050, even more typically at least 0.060 and most typically at least 0.065 at a wavelength of 13.5 nm. Such a high extinction coefficient k permits the thickness of the EUV absorbing structure to be less than 40 nm or less than 35 nm while remaining sufficiently absorbing. For instance, the thickness of the EUV absorbing structure may be from 25 to 35 nm. This represents an improvement when compared to using TaBN for the EUV absorbing structure where this thickness generally must be at least 60 nm.

In embodiments, the EUV absorbing structure may comprise a metallic material comprising an element selected from Ni, Co, Sb, In, Sn, and Ag.

In embodiments, the EUV absorbing structure may comprise a layer consisting of an element selected from Ni, Co, Sb, In, Sn, and Ag.

In embodiments, the EUV absorbing structure may comprise a layer consisting of an alloy of an element selected from Ni, Co, Sb, In, Sn, and Ag with one or more other elements. Generally, the resulting alloy has an extinction coefficient k of at least 0.040, more typically at least 0.050, even more typically at least 0.060 and most typically at least 0.065 at a wavelength of 13.5 nm. For instance, the EUV absorbing structure may comprise a layer of NiPt. Generally, at least 50% atomic composition of the alloy is made of elements selected from Ni, Co, Sb, In, Sn, and Ag.

In embodiments, the EUV absorbing structure may consist in a single layer of an element selected from Ni, Co, Sb, In, Sn, and Ag.

In embodiments, the EUV absorbing structure may consist of a single layer consisting of an alloy of an element selected from Ni, Co, Sb, In, Sn, and Ag with one or more other elements. Generally, the resulting alloy has an extinction coefficient k of at least 0.040, more typically at least 0.050, even more typically at least 0.060 and most typically at least 0.065 at a wavelength of 13.5 nm. For instance, the EUV absorbing structure may comprise a layer of NiPt. Generally, at least 50% atomic composition of the alloy is made of elements selected from Ni, Co, Sb, In, Sn, and Ag.

In embodiments, the extreme ultraviolet absorbing structure may comprise layers of extreme ultraviolet absorbing metallic material comprising an element selected from Ni, Co, Sb, In, Sn, and Ag (e.g. having an extinction coefficient k of at least 0.040, more typically at least 0.050, even more typically at least 0.060 and most typically at least 0.065 at a wavelength of 13.5 nm) alternated with spacer layers.

In embodiments, the EUV absorbing structure may consist of alternating layers of an element selected from Ni, Co, Sb, In, Sn, and Ag with spacer layers.

In embodiments, the EUV absorbing structure may consist of alternating a) layers of an alloy of an element selected from Ni, Co, Sb, In, Sn, and Ag with one or more other element, with b) spacer layers. Generally, at least 50% atomic composition of the alloy is made of elements selected from Ni, Co, Sb, In, Sn, and Ag.

In some embodiments, the EUV absorbing structure may comprise one or more doped metal layers, e.g. metal layers doped with up to 20% atomic composition of B or P.

Generally, the resulting alloy involved in the layer described a) has an extinction coefficient k of at least 0.040, more typically at least 0.050, even more typically at least 0.060, and most typically at least 0.065 at a wavelength of 13.5 nm. For instance, these layers of an alloy may be layers of NiPt.

The elements Ni, Co, Sb, In, Sn and Ag can be advantageous as they have an extinction coefficient k of at least 0.065 at 13.5 nm and they can be selectively grown on the bottom of the cavity by ELD.

Generally, the filling material consists of Ni, Co, Ag, CoWP, Ni(B) or NiPt. Ni(B) is Ni doped with up to 20% atomic composition of B. Most typically, the filling material consists of Ni or Co. These two materials are metals and can be grown by ELD. Sn is typically avoided in EUV scanners. The melting point of Sn is very low which can also be a disadvantage. Sb is also generally avoided in EUV scanners because it is toxic when forming volatile hydrogen compounds such as $H_3Sb$. Ag has a higher tendency to crystallize than Co or Ni, leading to EUV absorbing structures having rough side walls, which is generally not preferred.

The spacer layers are made of a material different from Ni, Co, Sb, In, Sn, and Ag; and different from an alloy of an element selected from Ni, Co, Sb, In, Sn, and Ag with one or more other element. The spacer layers are typically not metallic. The spacer layers are typically made of an amorphous material. Examples of suitable spacer layers are TiN and MgO. Generally, the spacer layers are selected in such a way that the side walls of the cavity can be removed without removing the spacer layers.

Embodiments of this disclosure can be performed at a temperature lower than 250° C., typically lower than 180° C., more typically lower than 150° C. and yet more typically not larger than 100° C. This can result in a low thermal budget and hence a low consumption of energy. These embodiments also have the potential to prevent damaging the EUV mirror.

In embodiments, the assembly provided may further comprise: a self-assembled monolayer of a first type present in the cavity for promoting the selective formation of the extreme ultraviolet absorbing structure therein, and/or a self-assembled monolayer of a second type present on a surface not forming part of the cavity for preventing or inhibiting the formation of the extreme ultraviolet absorbing structure thereon.

In embodiments, the assembly may further comprise a capping layer on the extreme ultraviolet mirror and the cavity may expose part of the capping layer.

In embodiments, the assembly may further comprise a capping layer on the extreme ultraviolet mirror and an etch stop layer on the capping layer, wherein the cavity exposes part of the etch stop layer.

In embodiments, the cavity may extend into the extreme ultraviolet mirror and the extreme ultraviolet absorbing structure may be partly embedded in the extreme ultraviolet mirror so that its bottom surface is lower than the top surface of the extreme ultraviolet mirror and that its top surface is higher or at the same level as the top surface of the extreme ultraviolet mirror.

In embodiments, a seed layer may overlie the extreme ultraviolet mirror and the cavity may open on the seed layer.

In embodiments, the cavity may be formed by providing a mask layer over the extreme ultraviolet mirror followed by patterning the mask layer so as to form the cavity. In these embodiments, the method may further comprise removing the mask layer selectively with respect to: (i) the extreme ultraviolet absorbing structure, and (ii) the extreme ultraviolet mirror or the capping layer if present.

In embodiments, a thickness of the extreme ultraviolet absorbing structure may be 60 nm or below, 50 nm or below, or 35 nm or below.

In embodiments, the present disclosure relates to an extreme ultraviolet reticle obtainable by any method embodiments of the disclosure.

In embodiments, the present disclosure relates to an extreme ultraviolet reticle, comprising: an extreme ultraviolet mirror; and a metallic extreme ultraviolet absorbing structure comprising an element selected from Ni, Co, Sb, Ag, In, and Sn.

In particular, the metallic extreme ultraviolet absorbing structure may have straight side walls.

In particular, the metallic extreme ultraviolet absorbing structure may be formed of Ag, CoWP, Ni doped with B or NiPt; typically Ni or Co.

In particular, the metallic extreme ultraviolet absorbing structure may have side walls forming an angle with the top surface on the EUV mirror of from 70° to 110°, typically from 75° to 105°.

In embodiments, the present disclosure further relates to an intermediate structure for the making of an extreme ultraviolet reticle, the intermediate structure comprising an extreme ultraviolet mirror; a mask layer over the extreme ultraviolet mirror, the mask layer being patterned with a cavity extending from a top surface to a bottom surface of the mask layer; and an extreme ultraviolet absorbing structure filling at least partly the cavity, the extreme ultraviolet absorbing structure comprising an a metallic material comprising an element selected form Ni, Co, Sb, Ag, In, and Sn.

In this aspect, since the extreme ultraviolet absorbing structure is generally embedded laterally within a patterned dielectric template, which covers the capping layer typically present on the multi-layer mirror, the capping layer and the mirror will generally be protected against any damage that might happen if this intermediate reticle structure needs to be transported somewhere else or to another process tool.

EXAMPLE 1

Formation of a Reticle Including a Patterning Step into an SiO$_2$ Core

Example 1 is related to the formation of a reticle using SiO$_2$ as a template for the area selective deposition of Co or Ni (or compounds comprising Co or Ni). We now refer to FIG. 1. For this purpose, an assembly is provided comprising a multilayer EUV mirror (2) composed of alternating Si and Mo layers deposited on a (e.g., silicon) substrate (1). A 2.5 nm Ru capping layer (3) is present on the multilayer EUV mirror (2). In order to provide a cavity over the EUV mirror (2), the following steps can be performed at a temperature below 180° C. A SiO$_2$ layer (4) is provided on the Ru capping layer (3) by ALD. A SoC layer (5) is deposited on the SiO$_2$ layer (4) by spin-coating. A SoG layer (6) is deposited on the SoC layer (5) by spin-coating. A photoresist (7) is provided on the SoC layer (5) (e.g., on the SoG layer (6)). The photoresist (7) is patterned with an opening which laterally extends suitably for providing the cavity in the SiO$_2$ layer (4) after transfer therein. In an alternative embodiment, the SoG (6) and SoC (5) layers may be replaced by an SiOC and an amorphous carbon (APFtm) layer respectively. The SoG (6) and SoC (5) layers can be preferred because their use involves lower temperatures.

Figure 2:
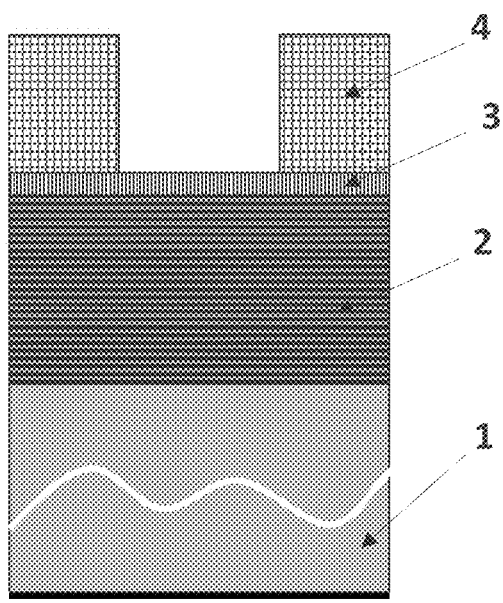
FIG. 2 is a schematic representation of a vertical cross-section of intermediates in the formation of a reticle during a method according to an embodiment of the present disclosure.

We now refer to FIG. 2. The pattern of the photoresist (7) is transferred into the SiO$_2$ layer (4) by a dry etching process. For this purpose, SoG (6) is opened with a fluorine-based plasma such as CF$_4$. Then, SoC (5) is opened with a N$_2$/H$_2$ plasma. The photoresist (7) is consumed during this step. Then, SiO$_2$ (4) is etched with a C$_4$F$_8$/CHF$_3$/CF$_4$/O$_2$ plasma. The SoG (6) is consumed during this step. This etching stops at the Ru capping layer (3) which serves as an etch stop layer. The remaining SoC (5) is then stripped with an O$_2$ plasma or a N$_2$H$_2$ plasma. In an alternative embodiment, the Ru capping layer has a Co layer or a Ni layer thereon to serve as a seeding layer for the formation of the EUV absorbing structure. In that embodiment, the etching of the SiO$_2$ (4) stops at that Co layer or Ni layer.

Figure 3:
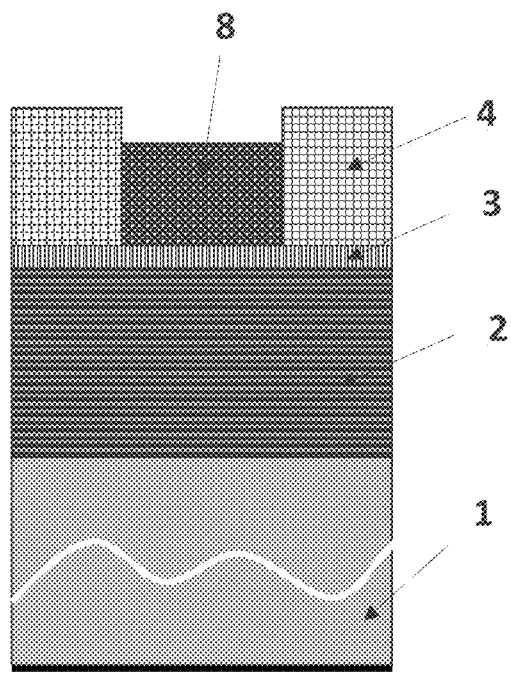
FIG. 3 is a schematic representation of a vertical cross-section of intermediates in the formation of a reticle during a method according to an embodiment of the present disclosure.

We now refer to FIG. 3. A 33 nm metal layer (8) (e.g., Co) is grown selectively in the cavity formed in the patterned SiO$_2$ layer (4) by ELD. In alternative embodiments, a Ni layer, a material comprising cobalt (e.g. CoWP) or a material comprising Ni (e.g. NiPt or Ni doped with B) can be grown instead of pure Co.

Figure 4:
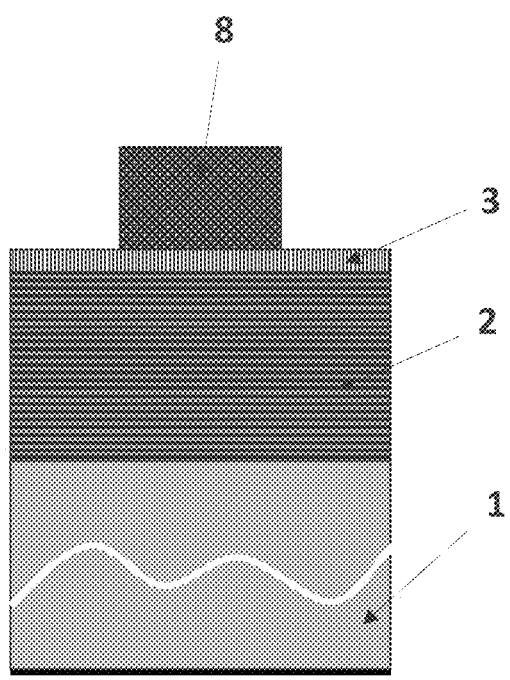
FIG. 4 is a schematic representation of a vertical cross-section of intermediates in the formation of a reticle during a method according to an embodiment of the present disclosure.

We now refer to FIG. 4. The patterned SiO$_2$ layer is removed selectively with respect to the Ru capping layer and the deposited metal with diluted HF.

With the obtained EUV absorbing structure being somewhat thin (33 nm), shadowing effects are low.

EXAMPLE 2

Formation of a Reticle Including a Patterning Step into an SoC Core

Figure 5:
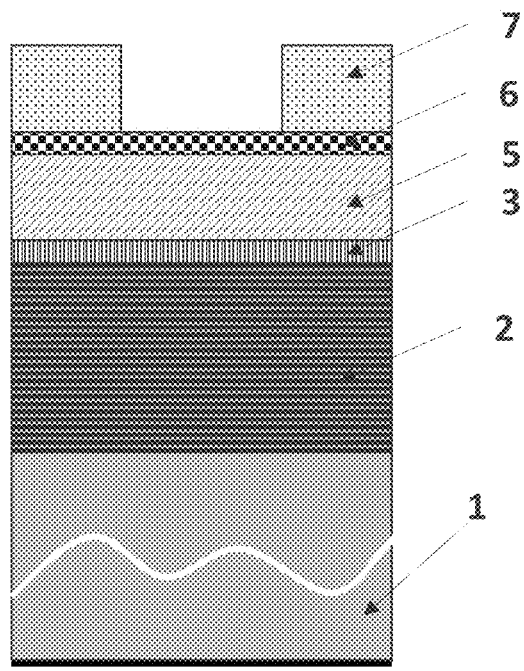
FIG. 5 is a schematic representation of a vertical cross-section of intermediates in the formation of a reticle during a method according to an embodiment of the present disclosure.

Example 2 is related to forming a reticle by using an organic layer (a spin-on-carbon layer) as a template for the area selective deposition of Co or Ni or compounds comprising the same. We now refer to FIG. 5. An assembly is provided comprising a multilayer EUV mirror (2) composed of alternating Si and Mo layers deposited on a substrate (1). A 2.5 nm Ru capping layer (3) is present on the multilayer EUV mirror (2). In order to provide a cavity over the EUV mirror, the following steps can be performed at a temperature below 180° C. A SoC layer (5) is provided on the Ru capping layer (3) by spin-coating. An SoG layer (6) is deposited on the SoC layer (5) by spin-coating. A photoresist (7) is provided on the SoG layer (6). The photoresist (7) is patterned with an opening which laterally extends suitably for providing the cavity in the SoC layer (5) after transfer therein.

Figure 6:
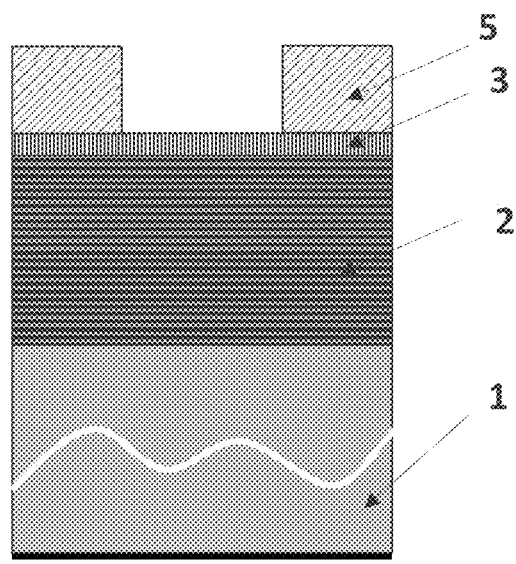
FIG. 6 is a schematic representation of a vertical cross-section of intermediates in the formation of a reticle during a method according to an embodiment of the present disclosure.

We now refer to FIG. 6. The pattern of the photoresist (7) is transferred into the SoG layer (6) by a dry etching process. SoG (6) is opened with a fluorine-based plasma such as $CF_4$. Then, SoC (5) is opened with a $N_2/H_2$ plasma. The photoresist (7) is consumed during this last step. This etching stops at the Ru capping layer (3) which serves as an etch stop layer. Remaining SoG (6) can be stripped with diluted HF which selectively etches SoG (6) with respect to SoC (5) and Ru (3).

Figure 7:
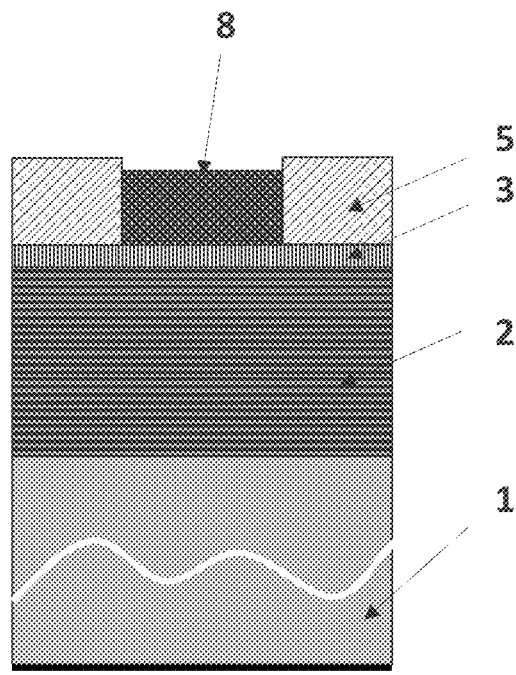
FIG. 7 is a schematic representation of a vertical cross-section of intermediates in the formation of a reticle during a method according to an embodiment of the present disclosure.

We now refer to FIG. 7. A 32 nm metal layer (8) (e.g., Ni) is grown selectively in the cavity formed in the patterned SoC layer (5) by ELD. In alternative embodiments, a Co layer, a material comprising cobalt (e.g. CoWP) or a material comprising Ni (e.g. NiPt or Ni doped with B) can be grown instead of pure Ni.

Figure 8:
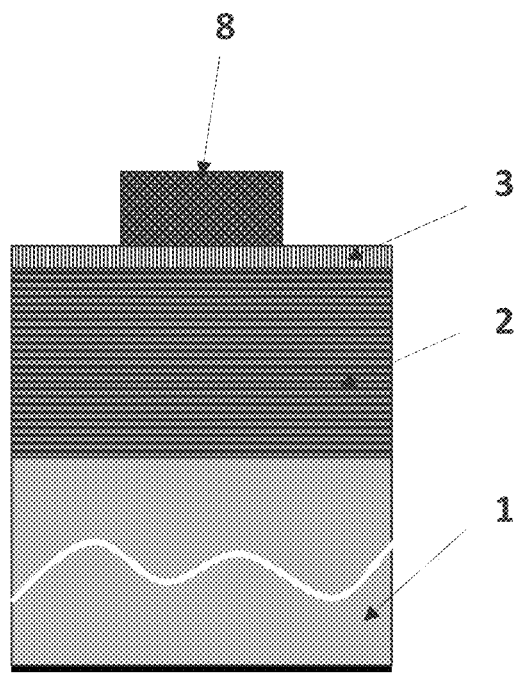
FIG. 8 is a schematic representation of a vertical cross-section of intermediates in the formation of a reticle during a method according to an embodiment of the present disclosure.

We now refer to FIG. 8. The patterned SoC layer (5) is removed selectively with respect to the Ru capping layer (3) and the deposited metal layer (8) with a $O_2$ or $N_2/H_2$ plasma.

With the obtained EUV absorbing structure being somewhat thin (32 nm), shadowing effects are low. The use of a SoC (5) for the side walls of the cavity as compared to $SiO_2$ (4) for the same purpose may allow obtaining an angle closer to 90° between the side walls and the mirror.

EXAMPLE 3

Figure 9:
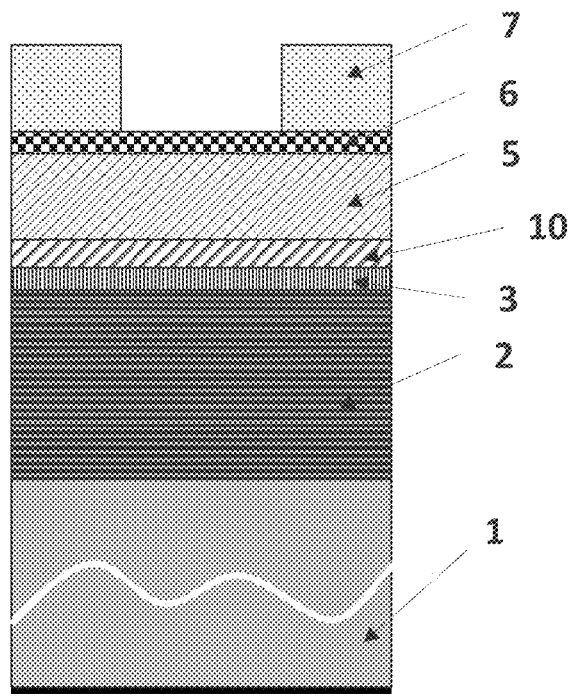
FIG. 9 is a schematic representation of a vertical cross-section of intermediates in the formation of a reticle during a method according to an embodiment of the present disclosure.

Formation of a Reticle Including a Cavity Forming Step into an SoC Core with a SAM at the Bottom of the Cavity Example 3 is related to forming a reticle by using an organic layer (5) (a spin-on-carbon layer) as a template for the area selective deposition of the metal layer (8) (e.g., Co, Ni, or compounds comprising the same) while introducing a $SiO_2$ or $Si_3N_4$ layer (10) as a protection layer on the Ru capping layer (3). We now refer to FIG. 9. An assembly is provided comprising a multilayer EUV mirror (2) composed of alternating Si and Mo layers deposited on a Si substrate (1). A 2.5 nm Ru capping layer (3) is present on the multilayer EUV mirror (2). A $SiO_2$ or $Si_3N_4$ layer (10) is deposited on the Ru capping layer (3) by a CVD process. In order to provide a cavity over the EUV mirror, the following steps can be performed at a temperature below 180° C. A SoC layer (5) is provided on the $SiO_2$ or $Si_3N_4$ layer (10) by spin-coating. An SoG layer (6) is deposited on the SoC layer (5) by spin-coating. A photoresist (7) is provided on the SoG layer (6). The photoresist (7) is patterned with an opening which laterally extends suitably for providing the cavity in the SoC layer (5) and part of the $SiO_2$ or $Si_3N_4$ layer (10) after transfer therein.

Figure 10:
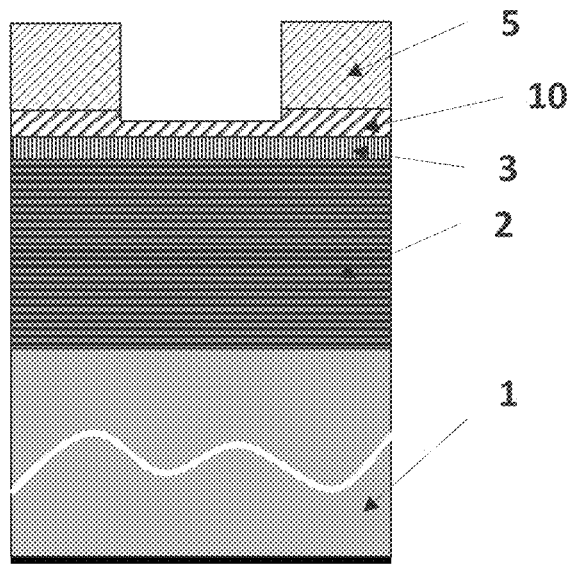
FIG. 10 is a schematic representation of a vertical cross-section of intermediates in the formation of a reticle during a method according to an embodiment of the present disclosure.

We now refer to FIG. 10. The pattern of the photoresist (7) is transferred into the SoG layer (6) by a dry etching process. SoG (6) is opened with a fluorine-based plasma such as $CF_4$. Then, SoC (5) is opened with a $N_2/H_2$ plasma. The photoresist (7) is consumed during this step. This etching is stopped at the $SiO_2$ or $Si_3N_4$ layer (10) which serves as an etch stop layer. Remaining SoG (6) can be stripped with diluted HF which selectively etches SoG (6) with respect to SoC (5) but etches part of the thickness of the $SiO_2$ or $Si_3N_4$ layer (10).

Figure 11:
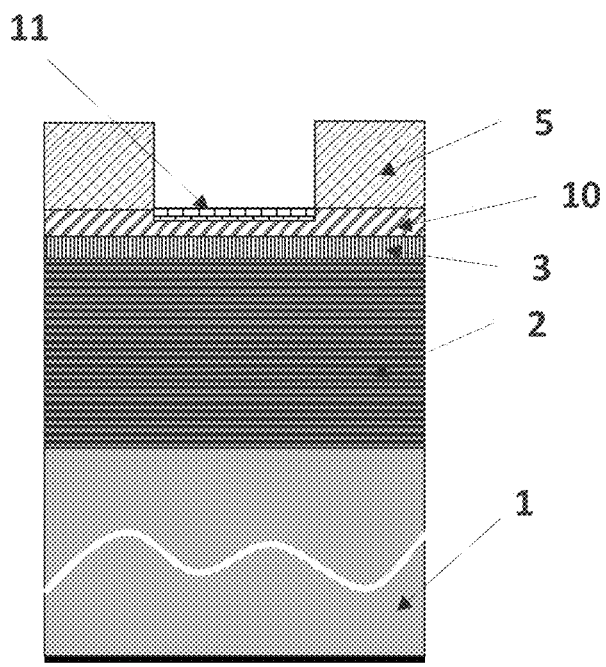
FIG. 11 is a schematic representation of a vertical cross-section of intermediates in the formation of a reticle during a method according to an embodiment of the present disclosure.

We now refer to FIG. 11. A SAM (11) is applied on the $SiO_2$ or $Si_3N_4$ layer (10) now accessible in the cavity. This SAM (11) comprises a reactive group for attaching selectively to the $SiO_2$ or $Si_3N_4$ layer (10). An example of a SAM is a silane group. This SAM (11) further comprises a group promoting metal deposition and therefore imparting selective metal deposition with respect to the other surfaces of the reticle under construction. An example of such groups are thiol groups and polar groups. The presence of these thiol groups generally increases the selectivity of the metal layer (8) deposition. The SAM (11) generally has a hydrophobic chain linking, on one hand, the reactive group for attaching selectively to the $SiO_2$ or $Si_3N_4$ layer, and on the other hand, the group promoting metal deposition. The hydrophobic chain may for instance be a hydrocarbyl comprising from 2 to 20 carbon atoms. The metal deposition can be performed by ELD via the use of a Pd catalyst and a metal precursor.

Figure 12:
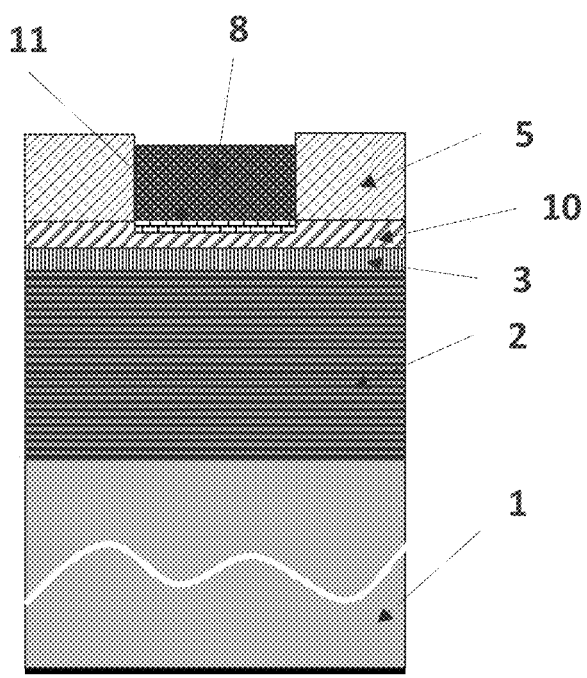
FIG. 12 is a schematic representation of a vertical cross-section of intermediates in the formation of a reticle during a method according to an embodiment of the present disclosure.

We now refer to FIG. 12. A 33 nm metal layer (8) (e.g., Co) is grown selectively in the cavity formed in the patterned SoC layer (5) by ELD. In alternative embodiments, a Ni layer, a material comprising cobalt (e.g. CoWP) or a material comprising Ni (e.g. NiPt or Ni doped with B) can be grown instead of pure Co.

Figure 13:
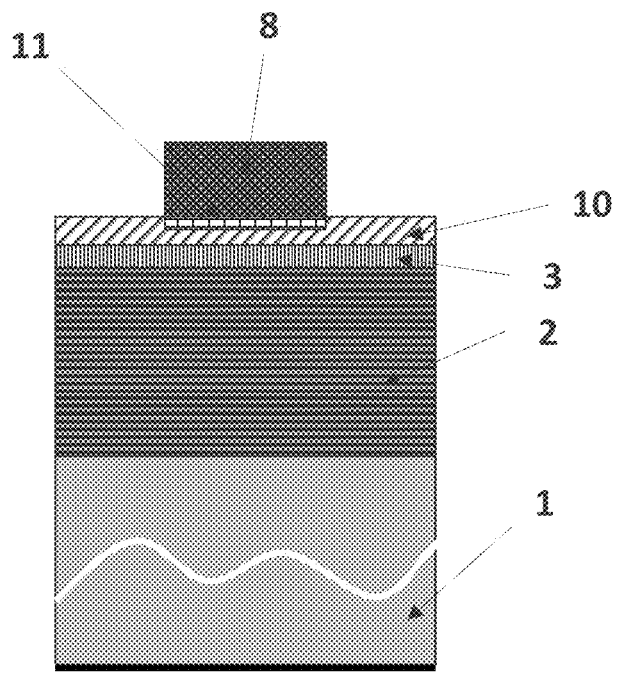
FIG. 13 is a schematic representation of a vertical cross-section of intermediates in the formation of a reticle during a method according to an embodiment of the present disclosure.

We now refer to FIG. 13. The patterned SoC layer (5) is removed selectively with respect to the $SiO_2$ or $Si_3N_4$ (10) and the deposited metal layer (8) with an $O_2$ or $N_2/H_2$ plasma.

Figure 14:
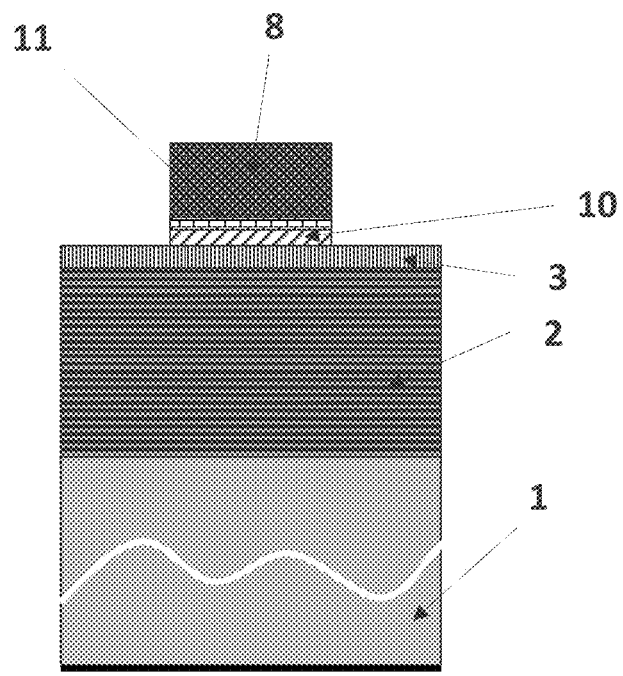
FIG. 14 is a schematic representation of a vertical cross-section of intermediates in the formation of a reticle during a method according to an embodiment of the present disclosure.

We now refer to FIG. 14. The $SiO_2$ or $Si_3N_4$ (10) can be etched selectively with respect to the Ru (3) and the metal layer (8) (e.g., Co) by using the metal layer (8) as a mask. If $Si_3N_4$ (10) is used, this etching can for instance be performed by using a $CHF_3/CF_4/O_2$ plasma.

With the obtained EUV absorbing structure being thin (33 nm), shadowing effects are low. The use of a SoC (5) for the side walls of the cavity as compared to $SiO_2$ (4) for the same purpose may allow obtaining an angle closer to 90° between the side walls and the mirror.

EXAMPLE 4

Formation of a Reticle Comprising an Embedded EUV Absorbing Structure

Figure 15:
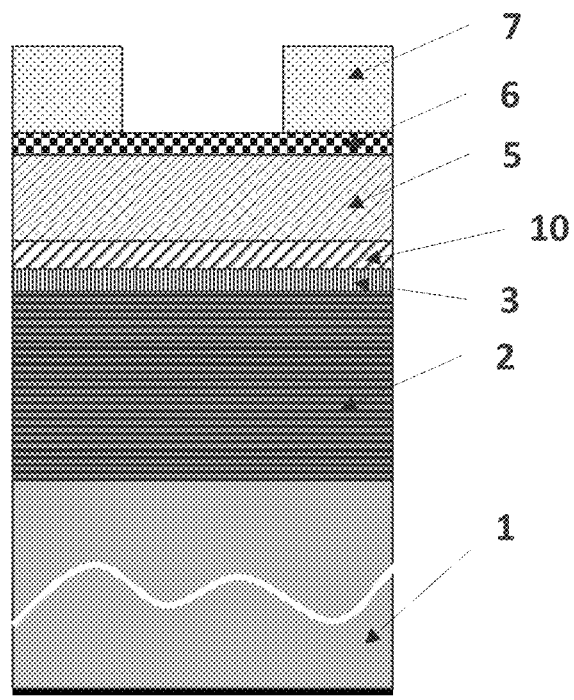
FIG. 15 is a schematic representation of a vertical cross-section of intermediates in the formation of a reticle during a method according to an embodiment of the present disclosure.

Example 4 is related to forming a reticle by using the multilayer EUV mirror as a template for the area selective deposition of a metal layer (8) (e.g., Co, Ni, or compounds comprising the same). We now refer to FIG. 15. An assembly is provided comprising a multilayer EUV mirror (2) composed of alternating Si and Mo layers deposited on a Si substrate (1). A 2.5 nm Ru capping layer (3) is present on the multilayer EUV mirror (2). A $SiO_2$ or $Si_3N_4$ layer (10) is deposited on the Ru capping layer (3) by a CVD process. In order to provide a cavity in the EUV mirror (2), the following steps can be performed at a temperature below 180° C. A SoC layer (5) is provided on the An SiO$_2$ layer (10) by spin-coating. An SoG layer (6) is deposited on the SoC layer (5) by spin-coating. A photoresist (7) is provided on the SoG layer (6). The photoresist (7) is patterned with an opening which laterally extends suitably for providing the cavity in the EUV mirror (2) after transfer therein.

Figure 16:
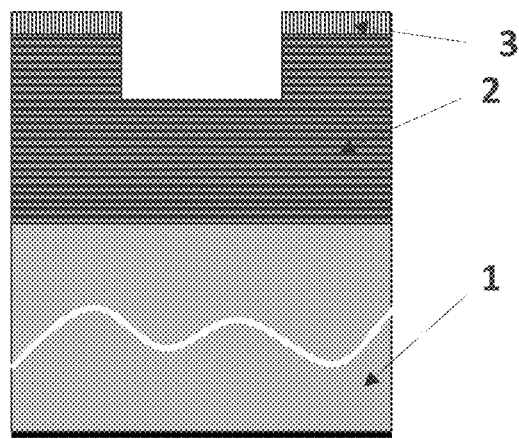
FIG. 16 is a schematic representation of a vertical cross-section of intermediates in the formation of a reticle during a method according to an embodiment of the present disclosure.

We now refer to FIG. 16. The pattern of the photoresist (7) is transferred into the SoG layer (6) by a dry etching process. SoG (6) is opened with a fluorine-based plasma such as CF$_4$. Then, SoC (5) is opened with a N$_2$/H$_2$ plasma. The photoresist (7) is consumed during this step. This etching is stopped at the SiO$_2$ layer (10) which serves as an etch stop layer. The SiO$_2$ layer (10) is then opened with a CHF$_3$/CF$_4$/O$_2$/C$_4$F$_8$ plasma. The SoG layer (6) is consumed during this step. The Ru capping layer (3) is etched with an O$_2$/Cl$_2$ plasma. The cavity is then transferred into the EUV mirror (2) by partially etching through it with a Cl$_2$ reactive ion etch or with a SF$_6$/CH$_2$F$_2$/He/N$_2$ plasma.

Figure 17:
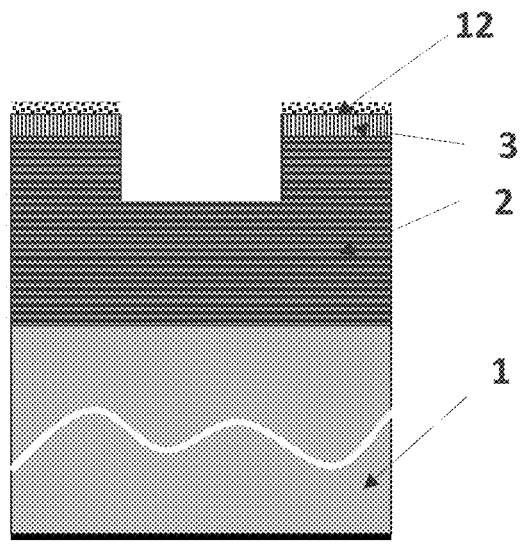
FIG. 17 is a schematic representation of a vertical cross-section of intermediates in the formation of a reticle during a method according to an embodiment of the present disclosure.

We now refer to FIG. 17. A SAM layer (12) is selectively applied on the Ru metal layer. A SAM layer (12) is for instance a SAM layer (12) having of general formula R—SH having a thiol group for attaching to the Ru layer and a R group for preventing or inhibiting metal layer (8) deposition.

Figure 18:
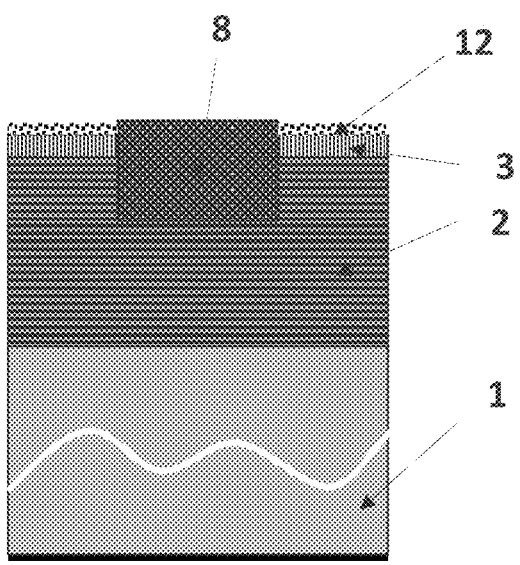
FIG. 18 is a schematic representation of a vertical cross-section of intermediates in the formation of a reticle during a method according to an embodiment of the present disclosure.

We now refer to FIG. 18. A 33 nm metal layer (8) (e.g., Co) is grown selectively in the cavity formed in the patterned EUV mirror (2) by ELD. In alternative embodiments, a Ni layer, a material comprising cobalt (e.g. CoWP), or a material comprising Ni (e.g. NiPt or Ni doped with B) can be grown instead of pure Co.

EXAMPLE 5

Formation of a Reticle Comprising a Multilayer EUV Absorbing Structure

Figure 19:
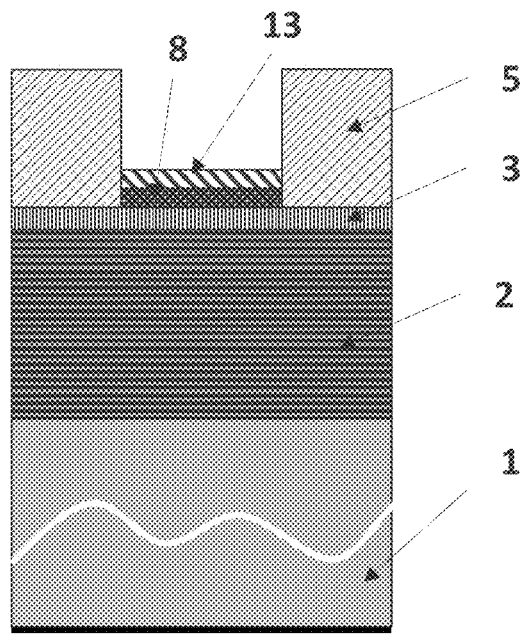
FIG. 19 is a schematic representation of a vertical cross-section of intermediates in the formation of a reticle during a method according to an embodiment of the present disclosure.

Example 5 is related to forming a reticle by using a SoC template for the area selective deposition of a multilayer EUV absorbing structure. FIG. 19 depicts a structure remaining after performing steps depicted in FIGS. 5 and 6 of example 2.

We now refer to FIG. 19. A metal layer (8) (e.g., Ni) is grown by ELD selectively in the cavity formed in the patterned SoC layer (5). A spacer layer (13) is then grown on the metal layer (8) by ALD. Each layer (8, 13) is thinner than 6 nm. In alternative embodiments, a Co layer, a material comprising cobalt (e.g. CoWP) or a material comprising Ni (e.g. NiPt or Ni doped with B) can be grown instead of pure Ni. For the spacer layer, TiN or MgO can, for instance, be used. Generally, after each deposition of a spacer layer (13), a treatment of the spacer layer (13) surface is performed to allow the deposition of a further metal layer (8) (e.g., Ni) thereon.

Figure 20:
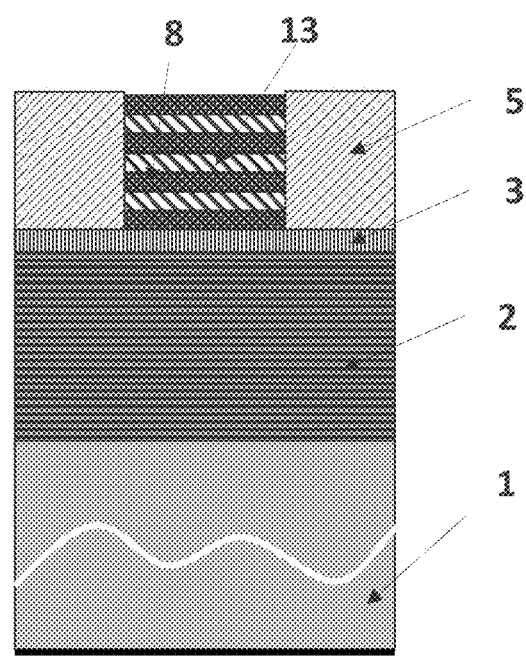
FIG. 20 is a schematic representation of a vertical cross-section of intermediates in the formation of a reticle during a method according to an embodiment of the present disclosure.

We now refer to FIG. 20. Further metal layers (8) (e.g., Ni) and spacer layers (13) are grown alternatively until, e.g., a thickness equal to 3.5 times a bilayer of a metal layer (8) (e.g., Ni)/spacer layer (13) is obtained. This alternation of metal layer (8) and spacer layers (13) can reduce the tendency of the metal to crystalize. It also can allow phase tuning. The thickness of the bilayer may be adapted to improve the focus shift.

EXAMPLE 6

A Substrate without EUV Mirror

Figure 21:
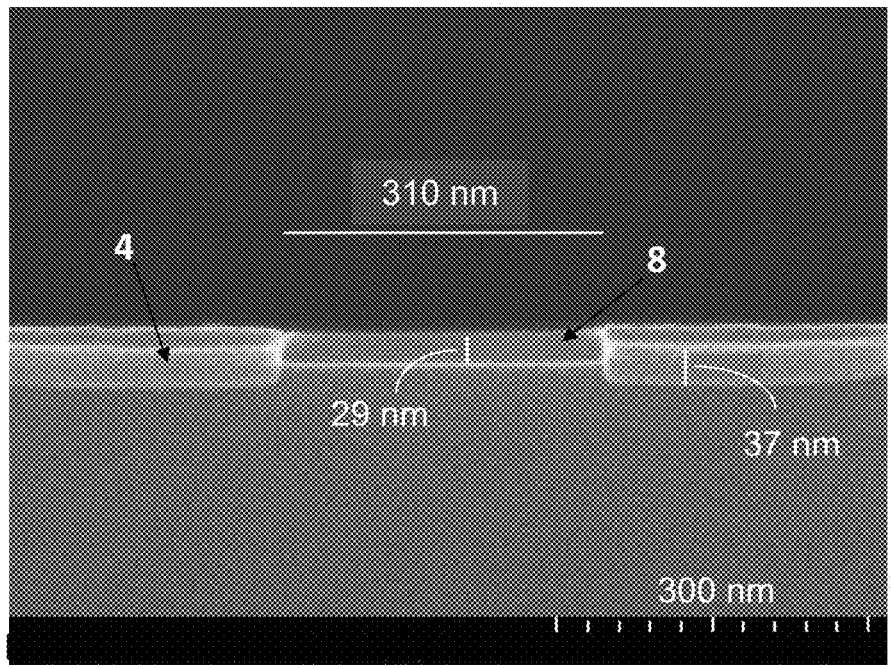
FIG. 21 is an electron micrograph showing a vertical cross-section of an assembly without an EUV mirror, according to an embodiment of the present disclosure.

We now refer to FIG. 21. Example 6 is related to growing cobalt selectively in a cavity formed in SiO$_2$. A Si substrate (1) was provided. A 2.5 nm Ru capping layer (3) was present on the Si substrate (1). A 3 nm Co layer was provided on the Ru layer (3) by ELD. In order to provide a cavity over the EUV mirror, the following steps can be performed at a temperature below 180° C. A SiO$_2$ layer (4) was provided on the 3 nm Co layer by ALD. A SoC layer (5) was deposited on the SiO$_2$ layer (4) by spin-coating. A SoG layer (6) was deposited on the SoC layer (5) by spin-coating. A photoresist (7) was provided on the SoC layer (5). The photoresist (7) was patterned with openings which laterally extend suitably for providing 310 nm wide trenches separated by 300 nm wide SiO$_2$ walls after transfer of the pattern in the SiO$_2$.

The pattern of the photoresist (7) was transferred into the SiO$_2$ layer (4) by a dry etching process. For this purpose, SoG (6) was opened with a CF$_4$ plasma. Then, SoC (5) was opened with a N$_2$/H$_2$ plasma. The photoresist (7) was consumed during this step. Then, SiO$_2$ (4) was etched with a C$_4$F$_8$/CHF$_3$/CF$_4$/O$_2$ plasma. The SoG (6) was consumed during this step. This etching stopped at the 3 nm cobalt layer which served as an etch stop layer. The remaining SoC (5) was then stripped with an O$_2$ plasma or a N$_2$H$_2$ plasma.

The resulting openings in the SiO$_2$ were 310 nm wide and 37 nm deep.

A 29 nm metal layer (8) (e.g., Co) was grown selectively in the cavity formed in the patterned SiO$_2$ layer (4) by ELD.

Figure 22:
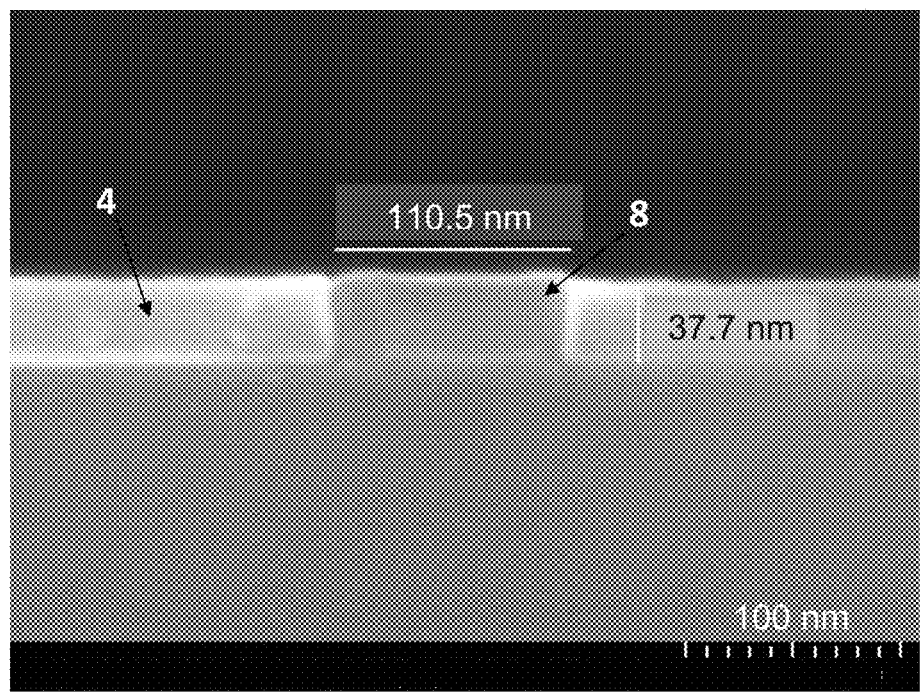
FIG. 22 is an electron micrograph showing a vertical cross-section of another assembly without an EUV mirror, according to an embodiment the present disclosure.

We now refer to FIG. 22. The same example was repeated but the photoresist (7) was patterned with openings which laterally extend suitably for providing 110.5 nm wide trenches separated by 200 nm wide SiO$_2$ walls after transfer of the pattern into the SiO$_2$. The resulting openings in the SiO$_2$ were 110.5 nm wide and 37.7 nm deep. These openings were completely filled with Co.

Figure 23:
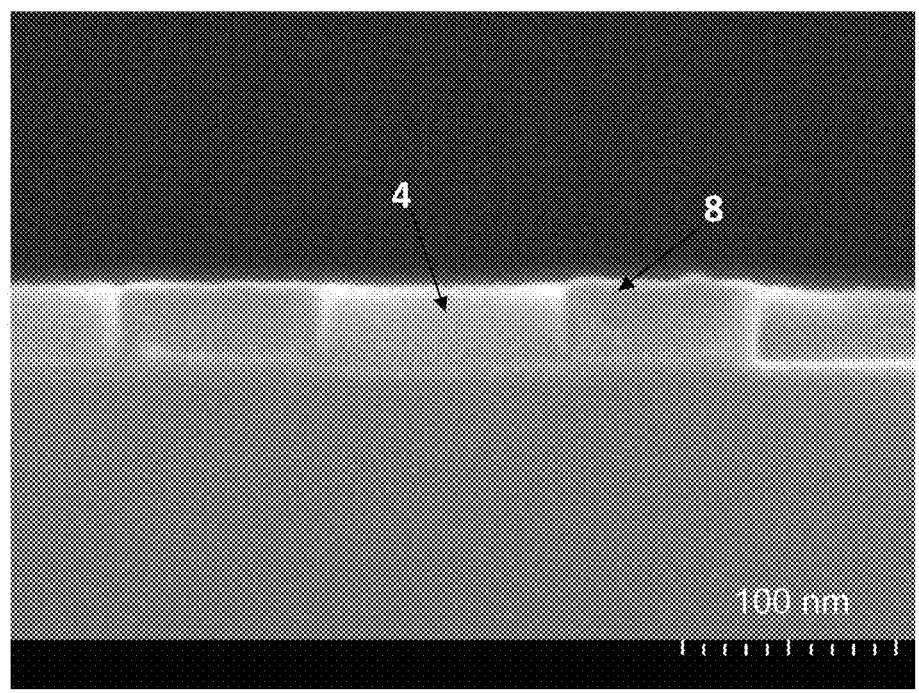
FIG. 23 is an electron micrograph showing a vertical cross-section of yet another assembly without an EUV mirror, according to an embodiment the present disclosure.

We now refer to FIG. 23. The same example was repeated but the photoresist (7) was patterned with openings which laterally extend suitably for providing ~100 nm wide trenches separated by ~100 nm wide SiO$_2$ walls after transfer of the pattern into the SiO$_2$. The resulting openings in the SiO$_2$ were ~100 nm wide and ~40 nm deep. These openings were completely filled with Co.

Comparative Example on a Substrate without EUV Mirror

The purpose of this comparative example was to test if a reticle could be formed by directly etching the desired reticle EUV absorber pattern by subtracting material from a Ni layer present on a Ru layer on a substrate. For this purpose, an assembly was provided comprising a 2.5 nm Ru capping layer present on a Si substrate. A 25 nm Ni layer was then deposited on the Ru layer. A 5 nm Ru layer was deposited on the Ni layer to serve as an etch stop layer. A 100 nm TiN layer was deposited on the Ru to serve as a hard mask. A 50 nm SiO$_2$ layer was deposited on the TiN layer, a 130 nm SoC layer was deposited on the SiO$_2$ layer, a 28 nm SoG layer was deposited on the SoC layer, and a photoresist was deposited and patterned on the SoG layer. This pattern was transferred to the hard mask in a series of etching steps. At this stage, two methods were tried to transfer the pattern into the Ni layer. The first method consisted in performing a physical reactive ion etch on the 5 nm Ru and the 25 nm Ni layer. The second method consisted of performing an ion beam etch on these same layers. In both cases, controllably stopping the etch at the bottom 2.5 nm Ru layer was not achieved. Indeed, both these methods suffered from a lack of selectivity toward Ni with respect to Ru. Furthermore, both methods lead to re-deposition of sputter Ni residue on the 2.5 nm Ru, away from where Ni was desired. Also, the profile obtained for the Ni structure was difficult to control for both methods.

It is to be understood that although embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for making a reticle, comprising:
   providing an assembly comprising:
      an extreme ultraviolet mirror;
      a cavity overlaying at least a bottom part of the extreme ultraviolet mirror;
      a first self-assembled monolayer of a first type present in the cavity; and
      a second self-assembled monolayer of a second type present on a surface not forming part of the cavity; and
   at least partly filling the cavity with an extreme ultraviolet absorbing structure comprising a metallic material comprising an element selected from Ni, Co, Sb, Ag, In, and Sn, by forming the extreme ultraviolet absorbing structure selectively in the cavity, wherein
      the first self-assembled monolayer is configured to promote selective formation of the extreme ultraviolet absorbing structure in the cavity, and
      the second self-assembled monolayer is configured to resist formation of the extreme ultraviolet absorbing structure thereon.

2. The method according to claim 1, wherein the cavity is either:
   comprised in a dielectric mask layer overlaying the extreme ultraviolet mirror, the cavity having a depth extending from a top surface of the dielectric mask layer to a bottom surface of the dielectric mask layer, or
   comprised in the extreme ultraviolet mirror, the cavity having a depth extending from a top surface of the extreme ultraviolet mirror to a level above a bottom surface of the extreme ultraviolet mirror.

3. The method according to claim 1, wherein the extreme ultraviolet absorbing structure comprises layers of metallic extreme ultraviolet absorbing material alternated with spacer layers.

4. The method according to claim 1, wherein forming the extreme ultraviolet absorbing structure selectively in the cavity comprises forming the extreme ultraviolet absorbing structure by electroless deposition.

5. The method according to claim 1 wherein the assembly further comprises a capping layer on the extreme ultraviolet mirror and wherein the cavity exposes part of the capping layer.

6. The method according to claim 5, wherein the capping layer comprises Ru.

7. The method according to claim 1 wherein the assembly further comprises a capping layer on the extreme ultraviolet mirror and an etch stop layer on the capping layer, wherein the cavity exposes part of the etch stop layer.

8. The method according to claim 1, wherein the extreme ultraviolet absorbing structure is embedded in the extreme ultraviolet mirror so that a bottom surface of the extreme ultraviolet absorbing structure is lower than a top surface of the extreme ultraviolet mirror and that a top surface of the extreme ultraviolet absorbing structure is higher or at the same level as the top surface of the extreme ultraviolet mirror.

9. The method according to claim 1, wherein a seed layer overlays the extreme ultraviolet mirror and wherein the cavity opens on the seed layer.

10. The method according to claim 1, wherein the cavity is formed by providing a dielectric mask layer over the extreme ultraviolet mirror followed by patterning the dielectric mask layer so as to form the cavity.

11. The method according to claim 10, further comprising removing the dielectric mask layer selectively with respect to:
    the extreme ultraviolet absorbing structure, and
    the extreme ultraviolet mirror or a capping layer.

12. The method according to claim 1, wherein a thickness of the extreme ultraviolet absorbing structure is 60 nm or less.

13. The method according to claim 1, wherein a thickness of the extreme ultraviolet absorbing structure is 50 nm or less.

14. The method according to claim 1, wherein a thickness of the extreme ultraviolet absorbing structure is 35 nm or less.

15. The method according to claim 1, wherein the extreme ultraviolet absorbing structure comprises a layer consisting of Ni, Co, Ag, CoWP, or Ni doped with up to 20% B or NiPt by atomic composition.

16. The method according to claim 1, wherein a thickness of the extreme ultraviolet absorbing structure is 50 nm or less.

17. The method according to claim 1, wherein a thickness of the extreme ultraviolet absorbing structure is 35 nm or less.

* * * * *